United States Patent
Chen et al.

(10) Patent No.: US 6,500,261 B1
(45) Date of Patent: Dec. 31, 2002

(54) APPARATUS FOR PREVENTING MISPLACEMENT OF A CASSETTE POD ONTO A PROCESS MACHINE

(75) Inventors: Jun-Bo Chen, Kaohsiung (TW); Kuo-Chen Lin, Tainan (TW); Chi-Pong Chiang, Yungkang (TW)

(73) Assignee: Taiwan Semiconductor Manufacturing Company, Ltd, Hsin Chu (TW)

( * ) Notice: Subject to any disclaimer, the term of this patent is extended or adjusted under 35 U.S.C. 154(b) by 0 days.

(21) Appl. No.: 10/032,344

(22) Filed: Dec. 21, 2001

(51) Int. Cl.⁷ .......................... B05C 13/00; B05C 13/02; B05C 21/00; B65G 49/07
(52) U.S. Cl. ................... 118/500; 118/502; 414/935; 414/936
(58) Field of Search .................. 118/500, 502; 414/935, 936, 938, 940, 217; 206/710

(56) References Cited

U.S. PATENT DOCUMENTS

| | | | | |
|---|---|---|---|---|
| 5,697,750 A | * | 12/1997 | Fishkin et al. | 414/217 |
| 6,220,808 B1 | * | 4/2001 | Bonora et al. | 414/217 |
| 6,261,044 B1 | * | 7/2001 | Fosnight et al. | 414/217 |
| 6,298,280 B1 | * | 10/2001 | Bonora et al. | 700/218 |
| 6,340,933 B1 | * | 1/2002 | Chen et al. | 340/687 |
| 6,352,403 B1 | * | 3/2002 | Fishkin et al. | 414/805 |
| 6,398,032 B2 | * | 6/2002 | Fosnight et al. | 206/710 |
| 6,419,438 B1 | * | 7/2002 | Rosenquist | 414/217 |
| 6,427,096 B1 | * | 7/2002 | Lewis et al. | 700/228 |

* cited by examiner

*Primary Examiner*—Alexander Ghyka
(74) *Attorney, Agent, or Firm*—Tung & Associates

(57) ABSTRACT

A method and an apparatus for preventing the misplacement of a cassette pod on the loadport of a process machine are described. In the method, a cassette pod that is equipped with an identification tag on a front panel is first provided, a process machine that is equipped with a loadport for receiving the cassette pod is then provided, at least one position verification block is mounted on the loadport at a first preset position, and then at least one position verification finger is mounted on the front panel of the cassette pod corresponding to the first preset position of the at least one position verification block such that when the cassette pod is placed on the loadport, the at least one position verification finger does not interfere with the at least one position verification block.

9 Claims, 3 Drawing Sheets

(1)

APPARATUS FOR PREVENTING MISPLACEMENT OF A CASSETTE POD ONTO A PROCESS MACHINE

FIELD OF THE INVENTION

The present invention generally relates to a method and an apparatus for loading/unloading a wafer cassette onto/from a loadport of a process machine and more particularly, relates to a method and an apparatus for loading a wafer cassette that is equipped with a position verification finger onto a loadport of a process machine that is equipped with a position verification block such that the misplacement of a wafer cassette onto a process machine can be avoided.

BACKGROUND OF THE INVENTION

In the manufacturing of a semiconductor device, the device is usually processed at many work stations or processing machines. The transporting or conveying of partially finished devices, or work-in-process (WIP) parts, is an important aspect in the total manufacturing process. The conveying of semiconductor wafers is especially important in the manufacturing of integrated circuit chips due to the delicate nature of the chips. Furthermore, in fabricating an IC product, a multiplicity of fabrication steps, i.e., as many as several hundred, is usually required to complete the fabrication process. A semiconductor wafer or IC chips must be transported between various process stations in order to perform various fabrication processes.

For instance, to complete the fabrication of an IC chip, various steps of deposition, cleaning, ion implantation, etching and passivation steps must be carried out before an IC chip is packaged for shipment. Each of these fabrication steps must be performed in a different process machine, i.e. a chemical vapor deposition chamber, an ion implantation chamber, an etcher, etc. A partially processed semiconductor wafer must be conveyed between various work stations many times before the fabrication process is completed. The safe conveying and accurate tracking of such semiconductor wafers or work-in-process parts in a semiconductor fabrication facility is therefore an important aspect of the total fabrication process.

Conventionally, partially finished semiconductor wafers or WIP parts are conveyed in a fabrication plant by automatically guided vehicles (AGV) or overhead transport (OHT) vehicles that travel on predetermined routes or tracks. For the conveying of semiconductor wafers, the wafers are normally loaded into cassettes pods, such as SMIF (standard machine interface) or FOUP (front opening unified pod), and then picked up and placed in the automatic conveying vehicles. For identifying and locating the various semiconductor wafers or WIP parts being transported, the cassettes or pods are normally labeled with a tag positioned on the side of the cassette or pod. The tags can be read automatically by a tag reader that is mounted on the guard rails of the conveying vehicle.

An OHT system is frequently used to deliver a cassette pod such as a FOUP to a process machine. This is shown in FIG. 1. A cassette pod 10 of the FOUP type is positioned on a loadport 12 of a process machine 14. The loadport 12 is frequently equipped with a plurality of locating pins 16 for the proper positioning of the cassette pod 10. A detailed perspective view of the FOUP 10 is shown in FIG. 2. The FOUP 10 is constructed of a body portion 18 and a cover portion 28. The body portion 18 is provided with a cavity 46 equipped with a multiplicity of partitions 48 for the positioning of 25 wafers of the 300 mm size. The body portion 18 is further provided with sloped handles 50 on both sides of the body for ease of manual transportation. On top of the body portion 18, is provided with a plate member 52 for gripping by a transport arm (not shown) of an OHT system (not shown).

During wafer processing, the wrong wafer cassette pod is sometimes placed on a loadport of a process machine. The machine-readable tag positioned on the side of the cassette pod and the tag reader mounted on the conveying vehicle do not always prevent such error from occurring. When the misplacement of a cassette pod on a process machine occurs, for instance, when a cassette pod filled with wafers to be processed in a front-end-of-line process is placed on a process machine that executes a back-end-of-line process, serious contamination problem occurs both on the wafers and in the process chamber. Similarly, serious contamination on the wafers and in the process chamber occurs when a cassette pod filled with wafers for a cobalt process is placed on a process machine that is used for depositing copper layers. It is desirable to have a method that can automatically detect such error when not detected by a human operator or by a tag reader.

It is therefore an object of the present invention to provide a contamination prevention device on a cassette pod for loading onto a process machine that does not have the drawbacks or shortcomings of conventional cassette pods.

It is another object of the present invention to provide a method for preventing misplacement of a cassette pod onto a process machine so that serious contamination to the wafers and to the process chamber can be avoided.

It is a further object of the present invention to provide a method for preventing misplacement of a cassette pod onto a process machine by mounting position verification fingers on the cassette pod and a position verification block on the process machine.

It is another further object of the present invention to provide a method for preventing misplacement of a cassette pod on a process machine by mounting position verification fingers on the cassette pod corresponding to the position of a position verification block mounted on the process machine onto which the cassette pod is to be placed.

It is still another object of the present invention to provide an apparatus for preventing misplacement of a cassette pod onto a process machine which includes a cassette pod, a process machine, at least one position verification block mounted on the process machine, and at least one position verification finger mounted on the cassette pod.

It is yet another object of the present invention to provide an apparatus for preventing misplacement of a cassette pod onto a process machine by providing various pairs of matched-position verification block/verification finger for various fabrication processes to be conducted on the process machine.

SUMMARY OF THE INVENTION

In accordance with the present invention, a method and an apparatus for preventing the misplacement of a cassette pod onto a process machine and thus avoiding contamination problems are provided.

In a preferred embodiment, a method for preventing misplacement of a cassette pod onto a process machine can be carried out by the operating steps of first providing a cassette pod that has a front panel, a back panel and two side panels; providing a process machine that is equipped with a loadport for receiving the cassette pod thereon; mounting at least one position verification block immediately adjacent to an outside periphery of the loadport at a first preset position on the process machine; and mounting at least one position verification finger on the front panel of the cassette pod at a first preset position on the front panel corresponding to the first preset position of the at least one position verification block such that when the cassette pod is mounted on the loadport, the at least one position verification finger does not interfere with and has a clearance of at least 1 mm from the at least one position verification block.

The method for preventing misplacement of a cassette pod on a process machine may further include the step of mounting two position verification blocks adjacent to the outside periphery of the loadport which are at least 5 cm apart from each other, the step of mounting one position verification finger on the front panel of the cassette pod, the step of adhesively mounting the at least one position verification block on the process machine, or the step of mechanically mounting the at least one position verification block on the process machine.

The method may further include the step of mounting a first position verification block at a first preset position on the process machine when the process machine is used for a front-end-of-line (FEOL) process, and mounting a second position verification block at a second preset position on the process machine when the process machine is used for a back-end-of-line (BEOL) process.

The method may further include the step of mounting a third position verification block at a third preset position on the process machine when the machine is used for a cobalt deposition process, and mounting a fourth position verification block at a fourth preset position on the process machine when the process machine is used for a copper deposition process.

The method may further include the step of mounting a first position verification finger at a first preset position on the front panel of the cassette pod when the pod is used for holding wafers for a FEOL process, or the step of mounting a second position verification finger at a second preset position on the front panel of the cassette pod when the cassette pod is used for holding wafers for a BEOL process. The method may further include the step of mounting a third position verification finger at a third preset position on the front panel of the cassette pod when the pod is used for holding wafers for a cobalt deposition process, or the step of mounting a fourth position verification finger at a fourth preset position on the front panel of the cassette pod when the pod is used for holding wafers for a copper deposition process.

The present invention is further directed to an apparatus for preventing misplacement of a cassette pod on a process machine which includes a cassette pod that has a front panel, a back panel and two side panels; a process machine that is equipped with a loadport for receiving the cassette pod thereon; at least one position verification block mounted immediately adjacent to an outside periphery of the loadport at a first preset position on the process machine; and at least one position verification finger on the front panel of the cassette pod at a first preset position on the front panel corresponding to the first preset position of the at least one position verification block such that when the cassette pod is mounted on the loadport, the at least one position verification finger does not interfere with and has a clearance of at least 1 mm from the at least one position verification block.

In the apparatus for preventing misplacement of a cassette pod on a process machine, the at least one position verification block may be two position verification blocks mounted on the process machine, the at least one position verification finger may be one position verification finger mounted on the front panel of the cassette pod. The at least one position verification block may be mounted on the process machine by adhesive means, or by screw means. The at least one position verification block may include a first position verification block mounted at a first preset position on the process machine used in a FEOL process. The at least one position verification block may include a second position verification block mounted at a second preset position on the process machine used in a BEOL process. The at least one position verification finger may include a first position verification finger mounted at a first preset position on the front panel of the cassette pod which holds wafers for a FEOL process, or may include a second position verification finger mounted at a second preset position on the front panel of the cassette pod which holds wafers for a BEOL process.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND ALTERNATE EMBODIMENTS

The present invention discloses a method and an apparatus for preventing the misplacement of a cassette pod on a process machine and thus, avoiding any contamination that may be caused by such misplacement.

The method for preventing misplacement of a cassette pod on a process machine can be carried out by first providing a cassette pod, then providing a process machine, then mounting at least one position verification block on the process machine, and mounting at least one position verification finger on the cassette pod. The cassette pod may be equipped with a front panel, a back panel and two side panels wherein the back panel may be removed for accessing the wafers stored in the pod. The process machine may be equipped with a loadport on top for receiving the cassette pod and for transporting wafers stored in the pod into the process machine. The at least one position verification block may be mounted immediately adjacent to an outside periphery of the loadport at a first preset position on the process machine. The at least one position verification finger may be mounted on the front panel of the cassette pod, or next to the identification tag, at a first preset position corresponding to the first preset position of the at least one position verification block such that when the cassette pod is mounted on the loadport, the at least one position verification finger does not interfere with and has a clearance of at least 1 mm from the at least one position verification block.

To provide a larger number of various position verification block/position verification finger combinations, at least two position verification blocks should be mounted on the process machine in cooperation with a position verification finger that is mounted on the cassette pod. For instance, the present invention novel apparatus can be advantageously used to identify wafers that are to be processed in a FEOL process, in a BEOL process, in a cobalt deposition process, in a copper deposition process, etc. When two position verification blocks are used on top of the process machine, the two blocks should be mounted at least 5 cm apart, and preferably, at least 8 cm apart from each other. The position verification finger is normally mounted on the identification tag on the front panel of the cassette pod, either on the left side or on the right side.

The present invention further discloses an apparatus that is used for preventing misplacement of a cassette pod on a process machine which includes a cassette pod, a process machine, at least one position verification block, and at least one position verification finger.

Figure 1:
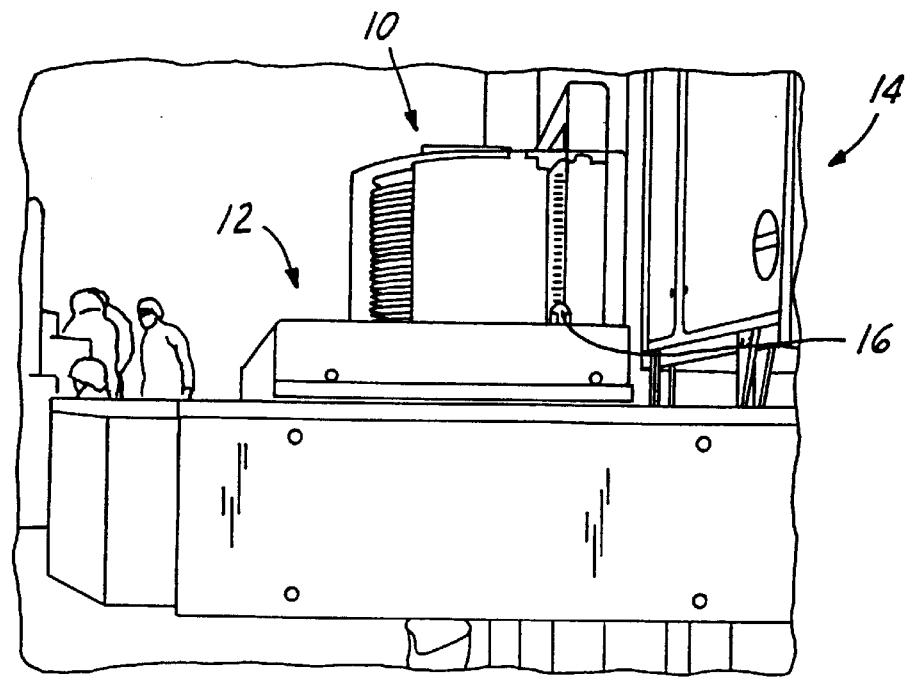
FIG. 1 is a perspective view of a cassette pod mounted on a loadport of a process machine.
Figure 2:
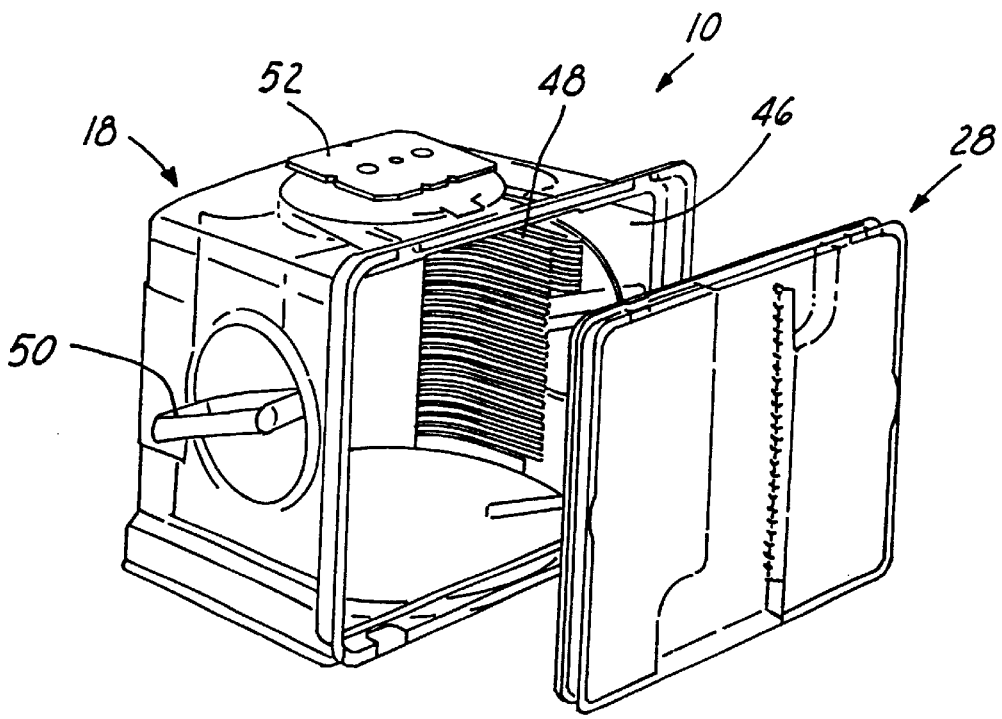
FIG. 2 is a perspective view of a cassette pod with a removable back panel for 300 mm wafers.
Figure 3:
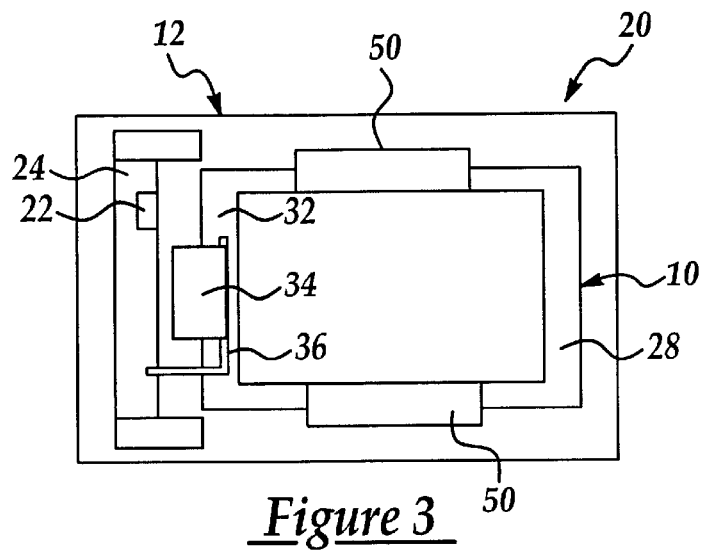
FIG. 3 is a plane view of the present invention apparatus equipped with one position verification finger and one position verification block.

Referring now to FIG. 3, wherein a plane view of a present invention apparatus 20 of a cassette pod 10 mounted on a loadport 12 of a process machine (not shown) is illustrated. The cassette pod 10 is equipped with a front panel 32 which is in turn equipped with an identification tag 34 and a position verification finger 36. The cassette pod 10 is also equipped with two sloped handles 50 on each side of the pod for manual transportation. The cassette pod 10 is further equipped with a removable back cover 28.

The loadport 12 is equipped with a position verification block 22 which is mounted on an outer periphery region 24 of the loadport 12.

Figure 4:
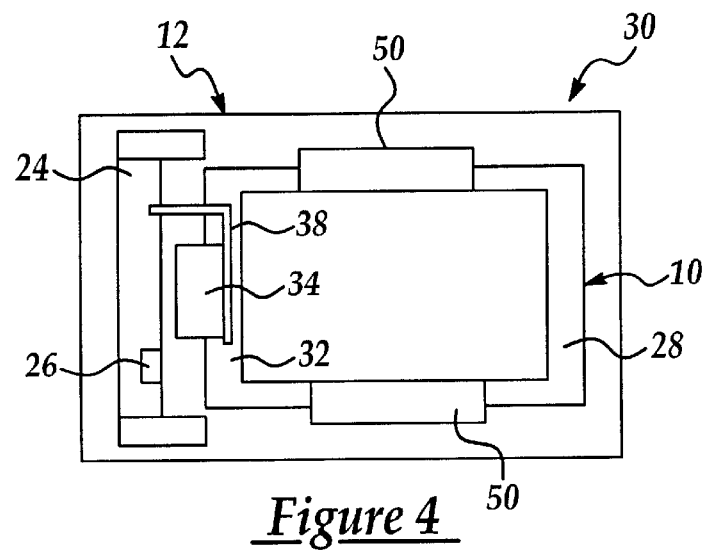
FIG. 4 is a plane view of a second embodiment apparatus equipped with one position verification finger and one position verification block.

Similarly, a plane view of a second embodiment of the present invention apparatus 30 is shown in FIG. 4, in which the position verification finger 38 is mounted in a position opposite that shown in the first embodiment of FIG. 3. Similarly, the position verification block 26 is mounted in an opposite position on the periphery 24 of the loadport 12. For instance, the position verification finger/position verification block set shown in FIG. 3 may be used to identify wafers stored in the cassette pod 10 for a FEOL process, while the wafers stored in the cassette pod 10 equipped with the position verification finger/position verification block combination shown in FIG. 4 may be processed for a BEOL process.

Figure 5:
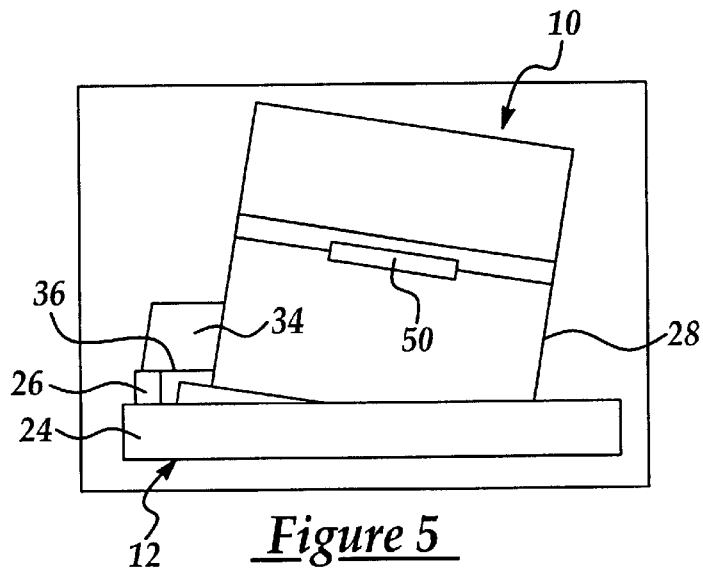
FIG. 5 is a side view of the cassette pod equipped with the present invention apparatus misplaced on a process machine.
Figure 6:
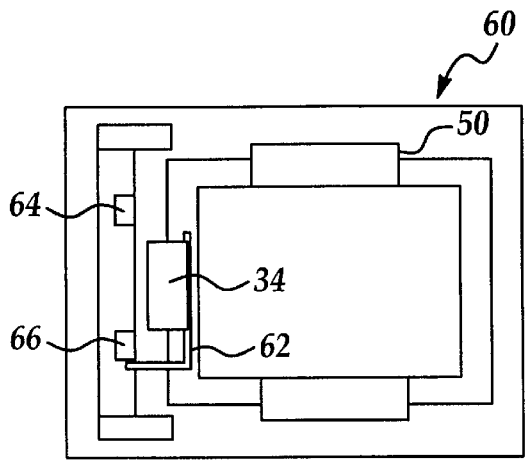
FIG. 6 is a plane view of a third embodiment of the present invention apparatus equipped with one position verification finger and two position verification blocks.
Figure 7:
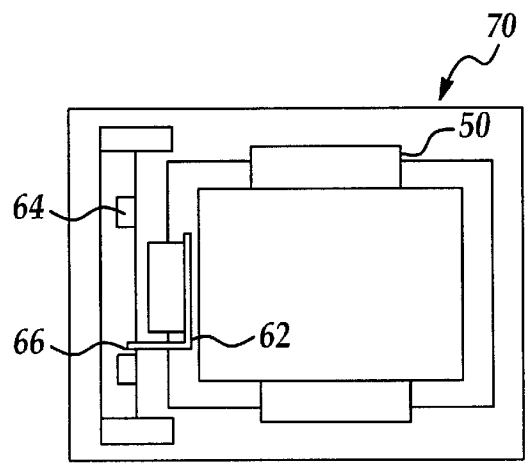
FIG. 7 is a plane view of a fourth embodiment of the present invention apparatus equipped with a position verification finger and two position verification blocks.
Figure 8:
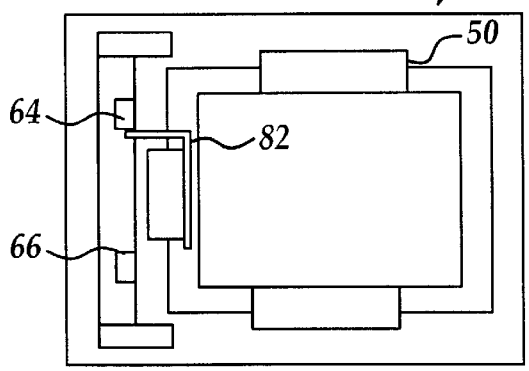
FIG. 8 is a plane view of a fifth embodiment of the present invention apparatus equipped with a position verification finger and two position verification blocks.
Figure 9:
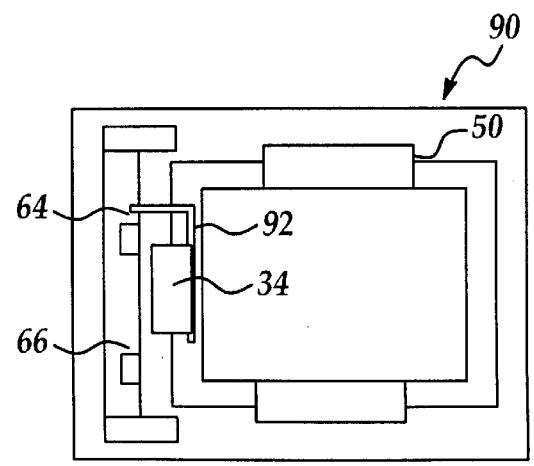
FIG. 9 is a plane view of a sixth embodiment of the present invention apparatus equipped with a position verification finger and two position verification blocks.

In order to avoid confusion or misplacement of the cassette pod 10 onto the wrong process machine, such as that shown in FIG. 5, the cassette pod 10 of FIG. 3 is positioned on the loadport 12 of FIG. 4, or vise versa. The position verification finger 36 collides with the position verification block 26 and thus, makes it impossible for the cassette pod 10 to be placed on the loadport 12. A potential contamination can thus be avoided.

FIGS. 6, 7, 8 and 9 are plane views illustrating a third, fourth, fifth and sixth embodiment of the present invention apparatus. For instance, the third embodiment shown in FIG. 6 and the sixth embodiment shown in FIG. 9 each has position verification fingers 62 and 92 positioned at a greater distance from the identification tag 34 when compared to the fourth and fifth embodiment shown in FIGS. 7 and 8.

Moreover, each of the embodiments shown in FIGS. 6~9 is equipped with two position verification blocks 64 and 66 which are positioned sufficiently apart, i.e. at a distance of at least 5 cm, and preferably, at a distance of at least 8 cm.

Various pairs of position verification block/position verification finger combinations can be formed by using the two position verification blocks 64,66 and the position verification fingers 62,72,82 and 92. For instance, the combination of the third embodiment shown in FIG. 6 may be used for wafers stored in the apparatus 60 ready to be processed in a BEOL process, the wafer stored in apparatus 70 are ready for process in a FEOL process, the wafers stored in apparatus 80 may be ready for a cobalt deposition process, and the wafer stored in apparatus 90 may be ready for a copper deposition process, etc. By fixing the two positions of the two position verification blocks 64,66, and changing the mounting position of the position verification fingers 62,72,82 and 92, such that the finger may fall in-between the position verification blocks 64,66 or fall outside of the blocks to advantageously provide four different variations shown in FIGS. 6~9. Any other suitable variations achieved by changing the positions or the numbers of the position verification blocks and the mounting positions of the position verification fingers can also be provided.

The present invention novel apparatus and method for preventing misplacement of a cassette pod on a process machine by utilizing position verification blocks on the process machine and position verification fingers on the cassette pod have therefore been amply described in the above description and in the appended drawings of FIGS. 3~9.

While the present invention has been described in an illustrative manner, it should be understood that the terminology used is intended to be in a nature of words of description rather than of limitation.

Furthermore, while the present invention has been described in terms of a preferred and five alternate embodiments, it is to be appreciated that those skilled in the art will readily apply these teachings to other possible variations of the inventions.

The embodiment of the invention in which an exclusive property or privilege is claimed are defined as follows.

What is claimed is:

1. An apparatus for preventing misplacement of a cassette pod on a process machine comprising:

a cassette pod having a front panel, a back panel and two side panels;

a process machine equipped with a loadport for receiving said cassette pod thereon;

at least one position verification block mounted immediately adjacent to an outside periphery of said loadport at a first preset position on said process machine; and at least one position verification finger on said front panel of said cassette pod of a first preset position on said front panel corresponding to said first preset of said at least one verification block such that when said cassette pod is mounted on said loadport, said at least one position verification finger does not interfere with and has a clearance of at least 1 mm from said at least one position verification block.

2. An apparatus for preventing misplacement of a cassette pod on a process machine according to claim 1, wherein said at least one position verification block is two position verification blocks mounted on said process machine.

3. An apparatus for preventing misplacement of a cassette pod on a process machine according to claim 1, wherein said at least one position verification finger is one position verification finger mounted on said front panel of the cassette pod.

4. An apparatus for preventing misplacement of a cassette pod on a process machine according to claim 1, wherein said at least one position verification block is mounted on said process machine by adhesive means.

5. An apparatus for preventing misplacement of a cassette pod on a process machine according to claim 1, wherein said at least one position verification block is mounted on said process machine by screw means.

6. An apparatus for preventing misplacement of a cassette pod on a process machine according to claim 1, wherein said at least one position verification block includes a first position verification block mounted at a first preset position on said process machine used in a front-end-of-line process.

7. An apparatus for preventing misplacement of a cassette pod on a process machine according to claim 1, wherein said at least one position verification block includes a second position verification block mounted at a second preset position on said process machine used in a back-end-of-line process.

8. An apparatus for preventing misplacement of a cassette pod on a process machine according to claim 1, wherein said at least one position verification finger includes a first position verification finger mounted at a first preset position on said front panel of the cassette pod which holds wafers for a front-end-of-line process.

9. An apparatus for preventing misplacement of a cassette pod on a process machine according to claim 1, wherein said at least one position verification finger includes a second position verification finger mounted at a second preset position on said front panel of the cassette pod which holds wafers for a back-end-of-line process.

* * * * *